United States Patent
Chen

(10) Patent No.: US 6,221,715 B1
(45) Date of Patent: Apr. 24, 2001

(54) METHOD OF MAKING POLYSILICON SELF-ALIGNED TO FIELD ISOLATION OXIDE

(75) Inventor: Bin-Shing Chen, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/123,500

(22) Filed: Jul. 28, 1998

(51) Int. Cl.[7] ............................................. H01L 21/8247
(52) U.S. Cl. ........................ 438/257; 438/263; 438/264; 438/299; 438/252; 438/593; 438/594
(58) Field of Search .................................. 438/262, 257, 438/263, 296, 294, 359, 438, 252, 633, 626, 631, 259, 264, 593, 299; 357/41, 27

(56) References Cited

U.S. PATENT DOCUMENTS

| | | | |
|---|---|---|---|
| 4,095,251 | * 6/1978 | Dennard et al. | 357/23 |
| 4,160,987 | * 7/1979 | Dennard et al. | 357/41 |
| 4,997,781 | 3/1991 | Tigelaar | 437/43 |
| 5,180,680 | 1/1993 | Yang | 437/38 |
| 5,488,586 | 1/1996 | Madurawe et al. | 365/218 |
| 5,595,924 | 1/1997 | Yuan et al. | 437/43 |
| 5,622,881 | 4/1997 | Acocella et al. | 438/264 |
| 5,691,215 | * 11/1997 | Dai et al. | 437/44 |
| 5,767,005 | 6/1998 | Doan et al. | 438/593 |
| 5,960,284 | 9/1999 | Lin et al. | 438/259 |
| 5,981,338 | * 11/1999 | Lee et al. | 438/257 |
| 6,008,112 | 12/1999 | Acocella et al. | 438/593 |

* cited by examiner

Primary Examiner—Matthew Smith
Assistant Examiner—Belur Keshavan
(74) Attorney, Agent, or Firm—Townsend and Townsend and Crew LLP

(57) ABSTRACT

A technique for forming an integrated circuit device having a self-aligned gate layer. The method includes a variety of steps such as providing a substrate, which is commonly a silicon wafer. Field isolation regions including a first isolation region and a second isolation region are defined in the semiconductor substrate. A recessed region is defined between the first and second trench isolation regions. The isolation regions are made using a reactive ion etching technique. A thickness of material such as polysilicon is deposited overlying or on the first isolation region, the second isolation region, and the active region. A step of selectively removing portions of the thickness of material overlying portions of the first isolation region and the second isolation region is performed, where the removing step forms a substantially planar material region in the recessed region. The substantially planar material region is self-aligned into the recessed region using the removing step.

15 Claims, 5 Drawing Sheets

US 6,221,715 B1

METHOD OF MAKING POLYSILICON SELF-ALIGNED TO FIELD ISOLATION OXIDE

BACKGROUND OF THE INVENTION

The present invention relates to semiconductor integrated circuits and their manufacture. The invention is illustrated in an example with regard to the manufacture of a non-volatile memory cell such as, for example, a "flash" memory cell, but it will be recognized that the invention has a wider range of applicability. Merely by way of example, the invention may be applied in the manufacture of other semiconductor devices such as CMOS, microcontrollers, microprocessors, application specific integrated circuits, embedded memory applications, among others.

Industry has used or proposed a variety of non-volatile memory devices. An example of such a memory device is an erasable programmable read-only memory ("EPROM") device. The EPROM device is both readable, writable, and erasable, i.e., programmable. The EPROM is implemented using a floating gate field effect transistor, which has certain binary states. That is, a binary state is represented by the presence or absence of charge on the floating gate. The charge is generally sufficient to prevent conduction even when a normal high signal is applied to the gate of the EPROM transistor.

A wide variety of EPROMs is available. In a traditional form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "$E^2$PROM"). EEPROMs are often programmed and erased electrically by way of a phenomenon known as Fowler-Nordheiin tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Flash memory cells, however, are often bulky and difficult to fabricate in a desired space due to complex geometries of the multiple gate layers used to form the control and floating gates. Accordingly, flash memory cells generally cannot be integrated as tightly or closely as other types of memory devices. Additionally, flash memory devices often require a high gate coupling ratio to achieve desirable programmability and functionality. High gate coupling ratios are often achieved by way of increasing the surface area of the control gate relative to the floating gate while reducing the surface area of the floating gate that is coupled to the channel region of the memory cell. Unfortunately, it is often difficult to increase the gate coupling ratio without significantly increasing the size of the memory cell.

From the above it is seen that a flash memory cell structure that is relatively easy to fabricate, cost effective, and reliable is clearly desired.

SUMMARY OF THE INVENTION

According to the present invention, a technique including a method and device for the fabrication of an integrated circuit device such as a flash memory cell is provided. In an exemplary embodiment, the present invention provides a self-aligned gate layer or poly-1 layer using a novel sequence of fabrication processes. This self-aligned floating gate layer reduces the size of the resulting flash memory cell according to certain embodiments.

In a specific embodiment, the present invention provides a method of forming a semiconductor integrated circuit device that has a self-aligned gate structure. The method includes a variety of steps such as forming a plurality of isolation regions in a substrate, which is commonly a silicon wafer. Each of the plurality of isolation regions is defined by a volume of isolation material (e.g., CVD oxide) that is defined in the substrate, and that is defined extending outside the substrate to form a recessed region (e.g., trench) between at least two of the isolation regions. The method also includes a step of forming a thickness of material (e.g., polysilicon) in the recessed region and overlying the isolation regions, where the thickness of material can be defined by a substantially continuous layer overlying and filling the recessed region and overlying the isolation regions. A step of planarizing the thickness of material occurs by removing a portion of the thickness of material overlying the isolation regions to expose an upper surface of the isolation regions to form a substantially planar surface from the thickness of material overlying the recessed region and the isolation regions. The planarizing step forms, for example, a self-aligned gate structure from the thickness of material.

In an alternative specific embodiment, the present invention provides a novel memory integrated circuit, such as a flash memory device, but can be others. The device includes a semiconductor substrate. A first trench isolation region and a second trench isolation region are defined in the semiconductor substrate. The trench isolation regions has an active region defined in a recessed region between the first trench isolation region and the second trench isolation region. A tunnel dielectric layer is defined overlying the active region. The device also includes a self-aligned floating gate layer defined within the recessed region of the active region. To complete the gate structure, a dielectric layer is defined overlying the floating gate layer, and a control gate layer is defined overlying a portion of the floating gate layer. The present self-aligned gate structure reduces cell size and improves device integration, as well as other features.

Numerous benefits are achieved using the present invention over pre-existing or conventional techniques. In some embodiments, the present invention can provide a smaller cell size that improves device integration using a self-aligned poly-1 process. Additionally, the present invention can use presently available fabrication tools, such as chemical mechanical polishing or planarization, which do not require substantial capital costs if these tools are already available. Furthermore, the invention can prevent misalignment errors in some embodiments using the present self-aligned process. Moreover, gate coupling ratio can also be increased by way of the present self-aligned poly-1 process. These and other benefits are described throughout the present specification and more particularly below.

The present invention achieves these benefits in the context of known process technology. However, a further understanding of the nature and advantages of the present invention may be realized by reference to the latter portions of the specification and attached drawings.

DETAILED DESCRIPTION OF THE SPECIFIC EMBODIMENTS

Conventional Flash EEPROM Structures

Figure 1:
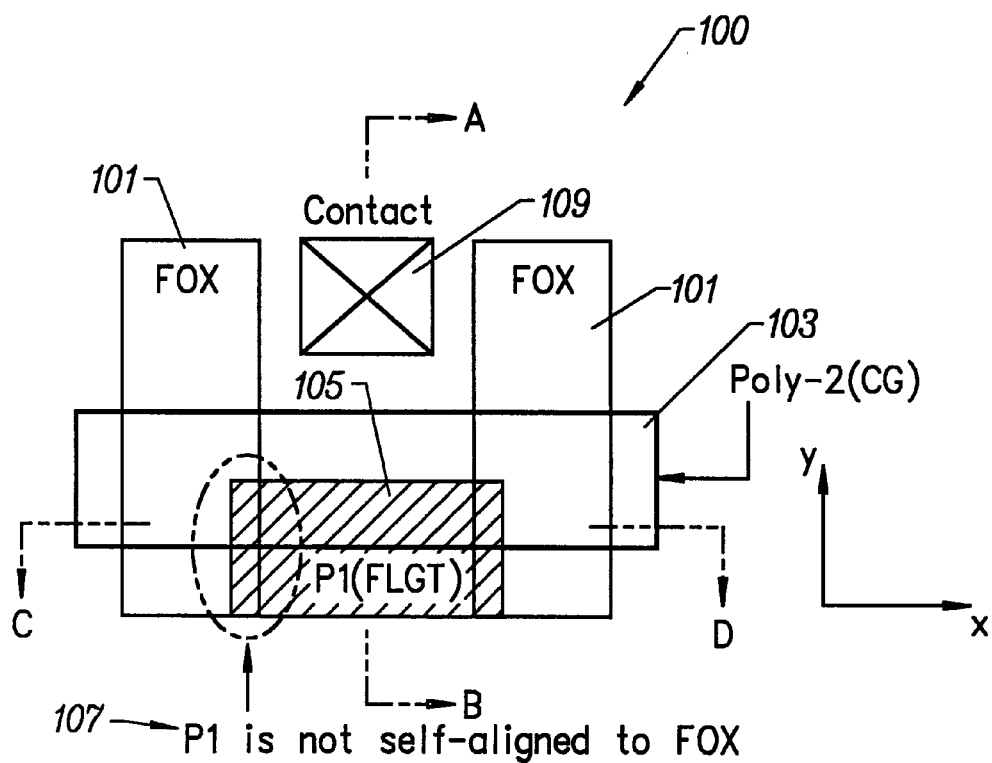
FIGS. 1–2 illustrate simplified diagrams of a conventional split gate flash memory cell.
Figure 2:
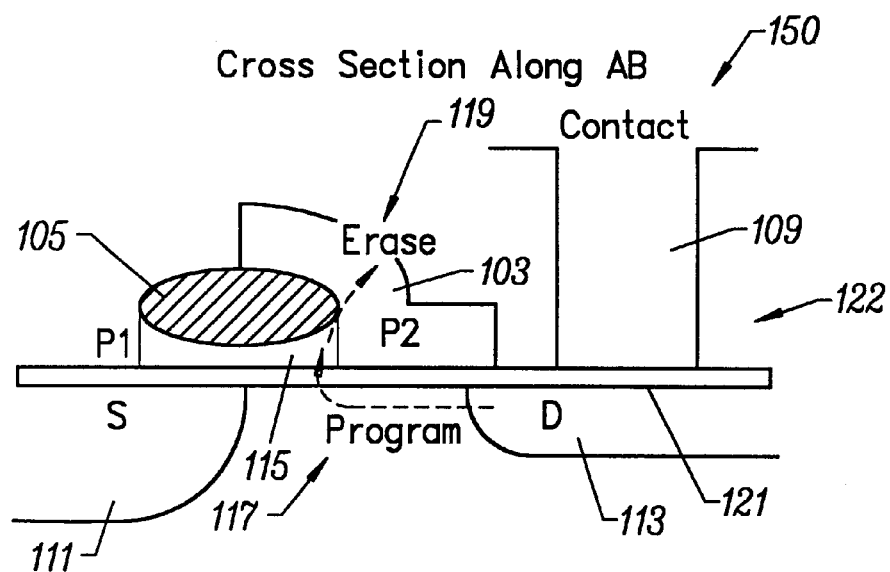
Figure 3:
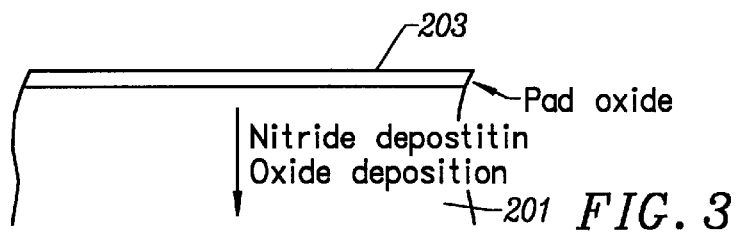
FIGS. 3–10 illustrate a method for fabricating a flash memory cell according to embodiments of the present invention.

FIGS. 1 and 2 illustrate simplified diagrams of a conventional split gate flash memory cell. As shown, the diagrams include a top-view or plan view 100 and a side-view or cross-sectional view 150 of the conventional split gate flash memory cell. The top-view diagram 100 shows field isolation oxide region(s) 101, which is commonly termed the FOX region. The FOX region separates and/or isolates one cell region from another cell region in the active device region. A flash memory device is defined between the FOX regions. The flash memory device includes a variety of features such as a floating gate 105 that is defined between and overlaps a portion of the FOX regions. A control gate 103 is defined overlying a portion of the floating gate and is defined overlying portions 107 of the FOX regions. A contact 109 to a source/drain region is also shown. The floating gate is made using conventional patterning techniques that form the floating gate structure which overlaps portions 107 of the FOX regions. This conventional floating gate is not self-aligned, and leads to larger cell sizes.

The side-view diagram 150 is made along a cross-section shown along line A to B in FIG. 1. The side-view diagram 150 of the flash memory device includes a substrate 117, which is commonly a semiconductor or silicon substrate. A dielectric layer 121 is defined overlying the top surface of the substrate 117. The dielectric layer 121 is typically called the tunnel oxide layer. A floating gate 115 is defined on the tunnel oxide layer. Control gate layer 103 is defined overlying a portion of the floating gate layer 105 to form the "split" gate configuration. A transistor source region 111 is defined in the substrate underlying the tunnel oxide layer. A transistor drain region 113 is defined in the substrate underlying the tunnel oxide layer. The drain region 113 is also coupled to the control gate layer 103. A contact region 109 is defined overlying the drain region 113. An interdielectric layer is defined overlying the transistor structures including portions of the control gate layer, the floating gate layer, FOX regions, and other transistor regions.

The above flash device is erased by Fowler-Nordheim tunneling of electrons. For example, selected voltages are applied to the $V_D$, $V_S$, and $V_{CG}$ to inject electrons through the edge of the floating gate to the control gate. The floating gate thereby becomes relatively more positively charged. This shifts the threshold voltage in the negative direction so that in the READ mode the transistor will be "on." In the program mode, the control gate is at a voltage of approximately 1.5 to 3.0 volts, while a high voltage is applied to the source junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

This conventional device needs high source to floating gate coupling ratio, but low control gate to floating gate coupling ratio. Numerous other limitations also exist in this conventional cell structure. As line widths become smaller, it becomes advantageous to reduce cell size. Cell size, however, is often limited by the size of the control gate layer, which should be sufficiently large to increase the gate coupling ratio of the flash device. Gate coupling ratio can be defined according to the simplified expression:

$$\text{Gate Coupling Ratio } C_{ono}/(C_{tox}+C_{ono})$$

where
  $C_{ono}$ is capacitance of the oxide/nitride/oxide; and
  $C_{tox}$ is capacitance of the tunnel oxide.

As shown in the above expression, gate coupling ratio ("GCR") is generally altered by altering the thickness of the tunnel oxide layer, which varies capacitance of such layer. Unfortunately, it is generally impossible to maintain effective device performance having a decreased tunnel oxide thickness for some conventional devices. Additionally, the geometric configuration of the conventional device limits the relative area of the tunnel oxide layer to the ONO layer. Accordingly, GCR simply cannot be adjusted in an easy and cost effective manner. Some manufacturers have attempted to provide different geometric configurations from the conventional device shown by FIGS. 1 and 2, but such configurations often come with additional expense or limitation in processing the device.

Present Device Methods and Structures

A method according to an embodiment of the present invention is briefly outlined as follows:

1. Provide semiconductor substrate;
2. Form pad oxide on substrate;
3. Form nitride layer on pad oxide;
4. Form oxide on nitride layer;
5. Pattern oxide and nitride layers;
6. Form trenches in substrate;
7. Form oxide in trenches;
8. Perform field implant;
9. Deposit CVD oxide;
10. Planarize CVD oxide;
11. Remove patterned nitride layer;
12. Remove pad oxide layer;
13. Perform high voltage implant;
14. Form gate dielectric layer;
15. Deposit gate layer on dielectric layer;
16. Dope gate layer;
17. Planarize gate layer;
18. Mask gate layer;
19. Etch gate layer;
20. Implant source/drain impurities; and
21. Perform remaining fabrication steps, as necessary.

The above sequence of steps shows a novel method of forming a gate layer according to an embodiment of the present invention. These sequences of steps provides numerous benefits such as the self-aligned gate structure, as well as others. The steps are merely an illustration and should not limit the scope of the claims herein. One of ordinary skill in the art would recognize other variations, alternatives, and modifications. Details of the above steps are shown by way of the Figs. below.

FIGS. 3–10 illustrate a method for fabricating a memory cell according to embodiments of the present invention using cross-sectional and top-view diagrams. These diagrams are merely illustrations and should not limit the scope of the claims herein. One of ordinary skill in the art would recognize other variations, modifications, and alternatives. The present method begins by forming an oxide layer 203, commonly termed pad oxide, overlying a top surface of a semiconductor substrate 201, which is often made of silicon, but can be other materials, as well. The pad oxide is generally formed by a thermal oxidation process using, for example, an annealing furnace. The pad oxide layer often has a thickness of less than about 0.1 micron, but can be at other thicknesses. Other types of materials can also be used instead of oxide for this layer.

Figure 4:
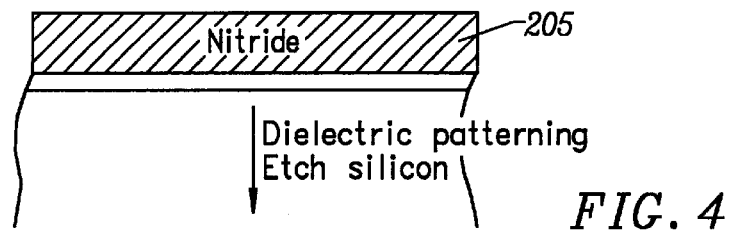

A masking layer 205 is defined overlying the pad oxide layer, as shown in FIG. 4. The masking layer 205 can be made of any suitable material that can withstand subsequent etching processes to be performed. In a specific embodiment, the masking layer material is a silicon nitride layer. The silicon nitride layer can be made using a variety of techniques such as chemical vapor deposition ("CVD"), plasma enhanced chemical vapor deposition ("PECVD"), and others. The silicon nitride layer is generally about 0.1 micron, but is not limited to this thickness.

Figure 5:
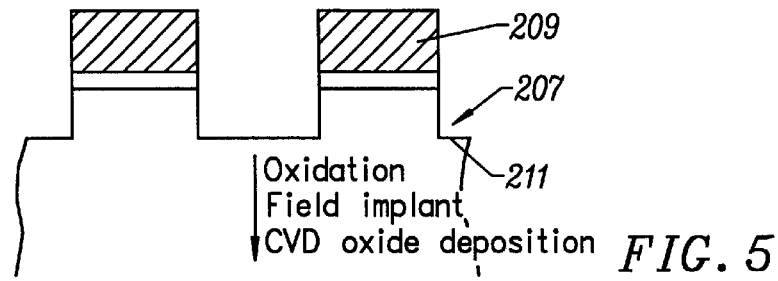

The masking layer is patterned, as shown in FIG. 5. The patterned masking layer can be patterned using a variety of techniques, including photolithography. The patterned layer forms exposed regions or openings overlying portions of the pad oxide or substrate. A step of etching occurs to remove portions of the exposed pad oxide and substrate. The etching is generally anisotropic which is substantially directional in nature. Etching can take place using techniques such as plasma etching, reactive ion etching, and other processes. These techniques can be dry as well as wet. The etching step forms substantially vertical trenches in the substrate. A typical trench includes an opening 207, sides, and a bottom region 211. Other embodiments, the bottom region 211 in each of the trenches have substantially a same or similar depth.

Figure 6:
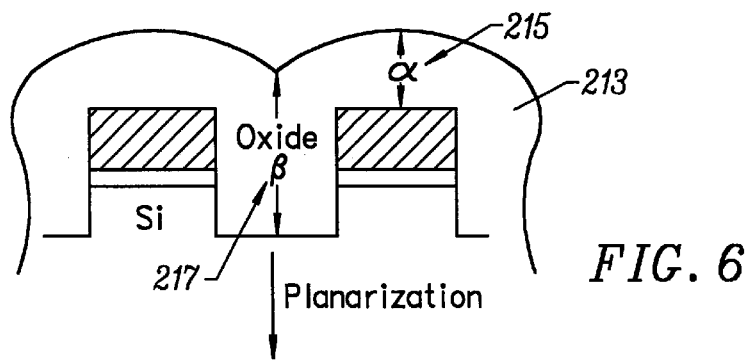

The method then performs a step of depositing a layer of dielectric material overlying the trenches and the patterned masking layer, as shown in FIG. 6. In particular, the dielectric layer overlies the bottom region, and the sides 209 and fills the opening 207 of each of the trenches. Unfortunately, most dielectric layer processes are not completely self-planarizing. Accordingly, the dielectric layer often has a portion 215 that is lower (β) (but thicker) overlying the bottom region of the trench than a portion 215 (α) of the dielectric layer overlying the patterned masking layer. The dielectric layer can be made of any suitable material such as borophosphosilicate glass ("BPSG"), phosphosilicate glass ("PSG"), CVD oxide, fluorinated glass ("FSG"), as well as other dielectric material.

Figure 7:
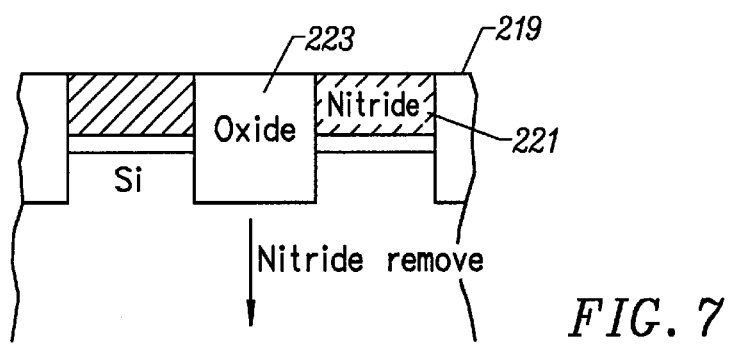

A planarizing step is used to remove portions of the dielectric layer to create isolation region(s) 223, as shown in FIG. 7. The isolation region has an upper surface 219 that is substantially even with the upper surface 221 of the patterned masking layer. Accordingly, the top surface of the partially completed device is substantially even in shape or geometry. The planarizing step often uses techniques such as chemical mechanical polishing or planarization. Chemical mechanical polishing or planarization, commonly referred as CMP, is a technique of polishing materials including semiconductor substrates and films overlying such substrates, which provides a high degree of uniformity and planarity. The process is used to remove high elevation features on films such as those portions of the dielectric layer on the isolation regions. Chemical mechanical polishing uses an apparatus having a single large polishing pad positioned on a platen, against which a substrate is positioned for polishing. A positioning member positions and biases the substrate to be polished against the polishing pad, which is rotating. A chemical slurry, which is likely to have abrasive materials, is maintained on the polishing pad to modify the polishing characteristics of the polishing pad and to enhance the polishing of the substrate or fills.

In a specific embodiment, the chemical mechanical polishing processes using a selected recipe. The polishing process selectively removes the dielectric material without damaging or removing the patterned masking layer. This recipe uses a slurry including an abrasive material such as a $SiO_2$-based material. A solution such as KOH is mixed with the abrasive material. The polishing pad is pressed against the dielectric layer to remove portions of the dielectric layer while leaving a substantially planarized layer defined in the trench. As shown, the substantially planarized layer has the same or similar height as the height of the masking layer. In other embodiments, the height of the substantially planarized layer is lower or even higher, but depends upon the application. By way of the trench forming process and planarizing process, a self-aligned layer of isolation material is defined.

Figure 8:
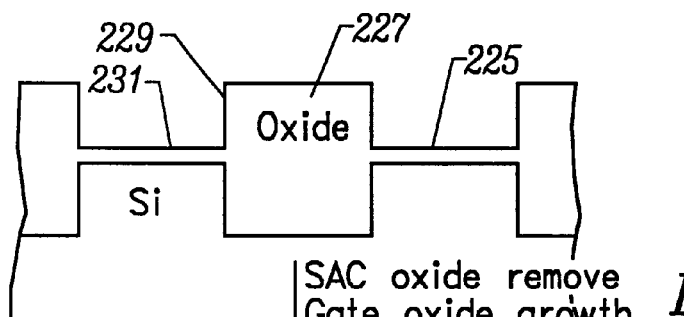

A selective etching process removes the patterned masking layer, as shown in FIG. 8. The selective etching process selectively removes the patterned masking layer without damaging or etching the isolation material 227 and/or the pad oxide layer 231. The etching process substantially removes the patterned masking layer without leaving any residual material on the isolation material 227 and/or the pad oxide layer 231. The etching process can be any suitable selective etching technique, including dry and/or wet processes. In an embodiment, the etching process is a wet process using chemicals such as hot $H_3PO_4$, but can also be others.

The pad oxide or "sacrificial oxide" is removed and a clean layer of gate dielectric material is grown overlying exposed substrate regions. The gate dielectric material is an oxide, which is commonly termed gate oxide. The gate oxide is often grown using a thermal oxidation technique or steam oxidation technique. Alternatively, the gate oxide can be replaced by other materials. These materials include silicon oxynitride, silicon nitride, and others. Additionally, multiple layers can be used as the gate dielectric layer.

In preferred embodiments, the gate dielectric is a "tunnel dielectric" layer. The tunnel dielectric layer is formed overlying the surface of the semiconductor substrate. In particular, the dielectric layer is defined within the active region between the isolation regions, which is shown by the protruding isolation material 227. The active region is generally within the trench between the two isolation regions, as shown. The tunnel dielectric layer is often made of a high quality oxide such as thermal oxide or the like. The dielectric layer can also be made of multiple layers as well as materials such as silicon oxynitrides, silicon nitride, and other materials.

Figure 9:
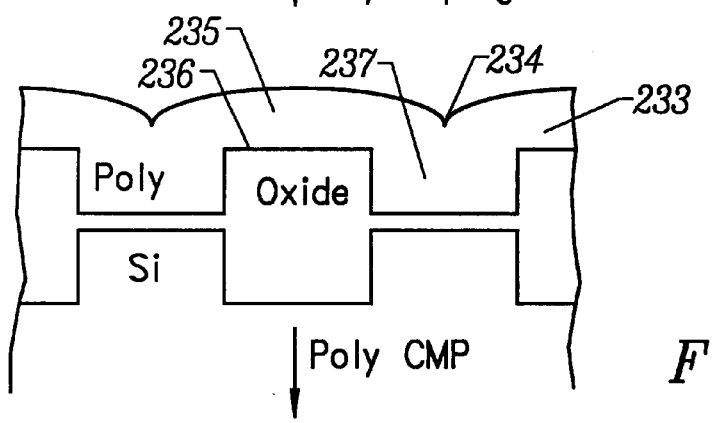

A polysilicon layer 233 is formed overlying the gate dielectric layer and isolation regions, as shown in FIG. 9. As shown, the polysilicon layer 237 has a relatively consistent thickness and has a portion 234 overlying the recessed region and a portion 235 overlying the field isolation regions 236. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffulsion (e.g., $POCl_3$), in-situ doping (e.g., $PH_3$), or ion implantation. In an embodiment using a design rule of about 0.4 micron or less, the thickness of the polysilicon layer is about 0.1 micron or less. The thickness generally does not matter in most embodiments due to the subsequent planarizing steps.

Figure 10:
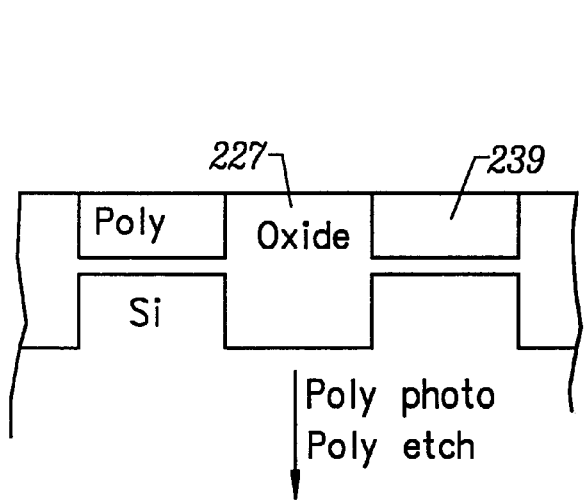
Figure 10:
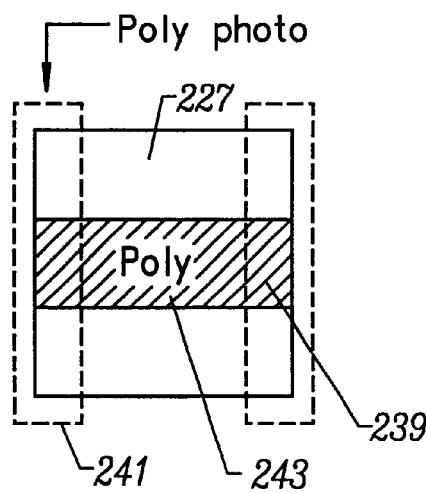

A planarizing step is performed to remove protruding portions of the polysilicon layer, as shown in FIG. 10. FIG. 10 shows both side-view and top-view illustrations. The planarizing step often uses techniques such as chemical mechanical polishing or planarization. Chemical mechanical polishing or planarization, commonly referred as CMP, is a technique of polishing materials including semiconductor substrates and films overlying such substrates, which provides a high degree of uniformity and planarity. The process is used to remove high elevation features on films such as those portions of the polysilicon layer on the isolation regions. Chemical mechanical polishing uses an apparatus having a single large polishing pad positioned on a platen, against which a substrate is positioned for polishing. A positioning member positions and biases the substrate to be polished against the polishing pad, which is rotating. A chemical slurry, which is likely to have abrasive materials, is maintained on the polishing pad to modify the polishing characteristics of the polishing pad and to enhance the polishing of the substrate or films.

In a preferred embodiment, the chemical mechanical polishing processes use a selected recipe. This recipe uses a slurry including an abrasive material such as a $SiO_2$-based material. A solution such as KOH is mixed with the abrasive material. The polishing pad is pressed against the polysilicon layer to remove portions of the polysilicon layer while leaving a substantially planarized layer defined in a recessed region between the isolation regions. As shown, the substantially planarized layer has the same or similar height as the height of the isolation regions. In other embodiments, the height of the substantially planarized layer is lower or even higher, but depends upon the application. By way of the polysilicon forming process and planarizing process, a self-aligned layer of polysilicon material is defined. As shown, the diagram has self-aligned polysilicon region 239 that has been aligned to the isolation region 227. The self-aligned polysilicon region 239 is also planarized and has an upper surface that is substantially even, level or continuous in a planar manner with isolation region 227. The polysilicon layer is also masked 241 and etched to leave a patterned polysilicon portion 243, which can become the floating gate structure. The present structure of FIG. 10 can be a starting structure for the manufacture of a variety of semiconductor device such as flash memory devices, dynamic random access memory devices, and a variety of other applications. Details of a method according to an embodiment of the present invention for making a flash memory cell is shown by way of the Figs. below.

FIGS. 11 to 14 illustrate a method of forming a flash memory cell having a stacked gate configuration according to an embodiment of the present invention. This method is merely an illustration and should not limit the scope of the claims herein. One of ordinary skill in the art would recognize other variations, modifications, and alternatives. Some of the reference numerals are similar in FIGS. 11 to 14 as one or more of the previous Figs. for easy cross-referencing, but are not intended to limit the scope of the claims in any manner.

Figure 11:
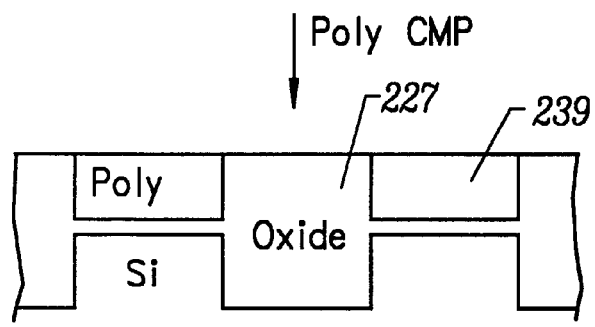
FIGS. 11–14 illustrate a method for fabricating a flash memory cell according to an alternative embodiment of the present invention.
Figure 12:
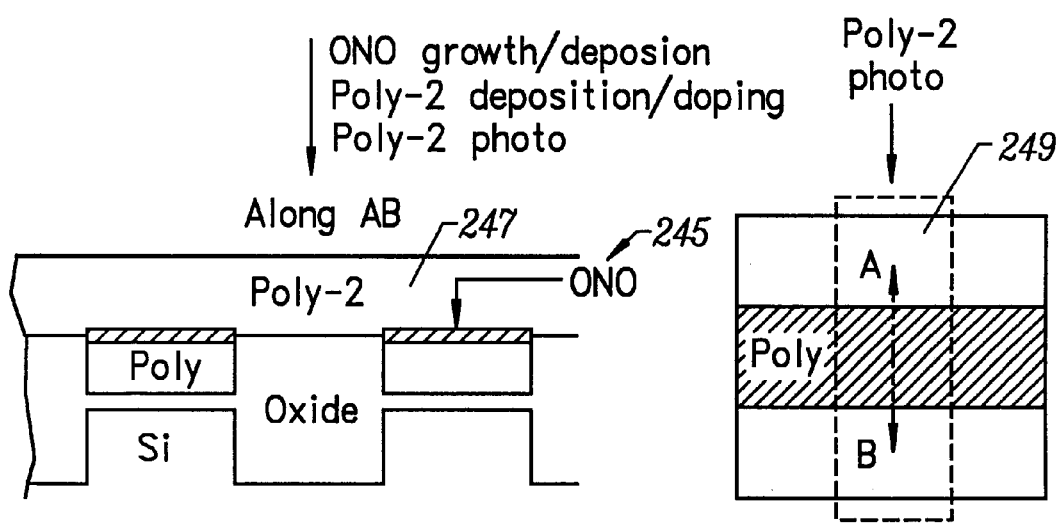

The diagram of FIG. 11 includes a variety of features such as the planarized self-aligned polysilicon region 239, which aligns with and is planarized with isolation region 227. A variety of process steps can now be performed to manufacture a flash memory cell, for example. In a specific embodiment, the present invention uses a step of forming a dielectric layer overlying the self-aligned polysilicon layer 239, which will be defined as a self-aligned floating gate. The layer of dielectric material 245 can be formed using a variety of techniques, as shown in FIG. 12. In particular, an oxide layer is defined overlying the first polysilicon layer. In a specific embodiment, the present invention uses a furnace oxidation process that relies upon thermal oxidation to form a dielectric layer such as an oxide layer. A thin nitride layer is deposited overlying the oxide layer. A subsequent oxide layer can be deposited overlying the nitride layer. The combination of the oxide/nitride/oxide is commonly termed ONO. Of course, the type of dielectric layer used depends upon the application.

A second polysilicon layer 247 or control gate layer is defined overlying the surface of the structure. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCL_3$), in-situ doping (e.g., $PH_3$), or ion implantation. The second polysilicon layer is defined using masking and etching steps. The top-view diagram in FIG. 12, which is shown along line AB, illustrates a photomasking layer 249.

Figure 13:
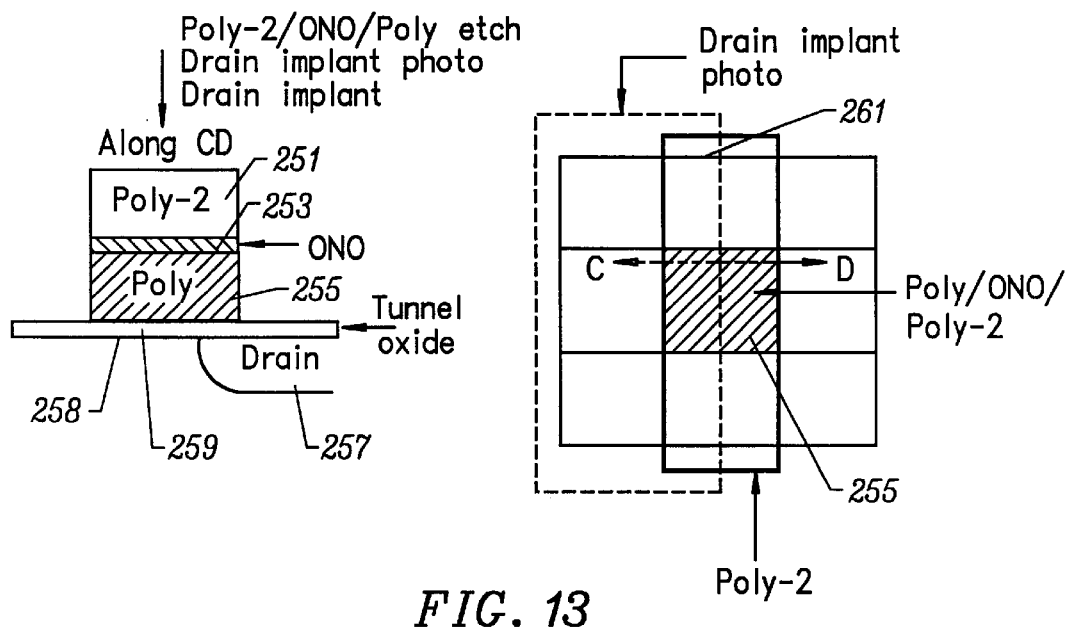

An etching step removes portions of the ONO layer and the second polysilicon layer to form the structure of FIG. 13, for example. The structure includes a variety of elements such as a floating gate 255, which is overlying tunnel oxide 259, an ONO layer 253, which is overlying the floating gate, and a control gate 251, which is overlying the ONO layer. The combination of these gates define a stacked gate configuration. A masking layer 261, which is shown in the top-view diagram (along line CD) of FIG. 13, is applied overlying exposed structural elements. An implanting step introduces impurities into a drain region, which is shown by reference numeral 257. The drain region is defined underlying the floating gate and adjacent to a channel region 258.

Figure 14:
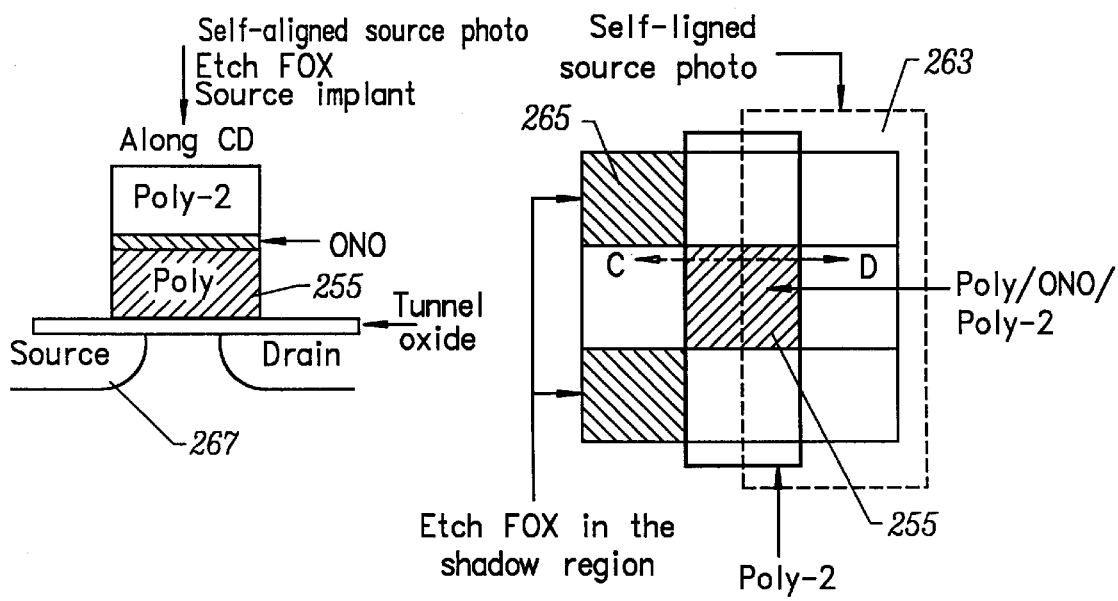

A source region 267 is formed, as shown in FIG. 14, for example. The source region is defined underlying the floating gate and adjacent to the channel region. To form the source region, a photomasking step defines photomasking layer 263. A selective etching step is performed to etch field isolation oxide regions 265. An implant step introduces impurities to define the source region 267. Accordingly, the flash memory device includes the completed source/drain regions, floating gate, control gate, and ONO layer. Additional processing steps are used to complete the flash memory device according to other embodiments of the present invention. In particular, these steps include forming metallization layers for interconnections, forming dielectric layers for isolation, packaging, and testing steps, as desired. Of course, the particular steps used depend upon the application.

The method of FIGS. 11–14 are merely examples of a process used to form a flash memory device having a stacked gate configuration. As an example, the present flash memory device should not limit the scope of the claims herein. One of ordinary skill in the art would recognize other variations, modifications, and alternatives.

While the above is a full description of the specific embodiments, various modifications, alternative constructions and equivalents may be used. For example, specific dimensions are discussed above for the specific embodiments. But of course, these dimensions may depend on the particular application. Therefore, the above description and illustrations should not be taken as limiting the scope of the present invention which is defined by the appended claims.

What is claimed is:

1. A method of forming a semiconductor integrated circuit device comprising a semiconductor substrate, said method comprising steps of:

forming a first isolation structure and a second isolation structure, each isolation structure having an upper surface, said first and second isolation structures defining a recessed region therebetween;

forming a thickness of material in said recessed region and overlying said first and second isolation structures; and planarizing said thickness of material by removing a portion of said thickness of material overlying said first and second isolation structures to expose the upper surface of said first and second isolation structures to form a substantially planar surface from said thickness of material overlying said recessed region and said isolation regions, wherein said thickness of material is self-aligned to said first and second isolation structures.

2. The method of claim 1 wherein said planarizing step is provided by chemical mechanical polishing.

3. The method of claim 1 wherein said isolation regions comprise oxide.

4. The method of claim 1 wherein said thickness of material comprises polysilicon.

5. The method of claim 1 wherein said semiconductor substrate is a silicon substrate.

6. The method of claim 1 wherein said thickness of material self aligned within said recessed region defines a transistor gate structure.

7. The method of claim 1 wherein said first and second of isolation structures are formed using steps comprising:

providing said substrate;

forming a masking layer overlying said substrate;

patterning said masking layer to form a first exposed region and a second exposed region overlying said substrate, said first exposed region and said second exposed region being separated by a third region defined by said patterned masking layer;

removing substrate material in said first exposed region and said second exposed region to define a first trench and a second trench, respectively;

forming a thickness of isolation material overlying said patterned masking layer and said first trench and said second trench to fill said first trench and said second trench;

planarizing said thickness of isolation material to remove a portion of said thickness of said isolation material to expose an upper surface of said patterned masking layer and form said first and second isolation structures; and removing said patterned masking layer to form said recessed region.

8. The method of claim 7 wherein said planarizing step for said thickness of isolation material is a chemical mechanical polishing process.

9. The method of claim 7 wherein said isolation material comprises oxide.

10. The method of claim 7 wherein said masking layer comprises silicon nitride.

11. A method of forming a semiconductor device comprising the steps of:

providing a semiconductor substrate;

forming a first trench isolation region and a second trench isolation region in said semiconductor substrate, said trench isolation regions having a recessed region therebetween, said recessed region defining an active region;

forming a dielectric layer overlying said active region;

depositing a thickness of material overlying said first trench isolation region, said second trench isolation region, and said active region;

selectively removing portions of said thickness of material overlying portions of said first trench isolation region and said second isolation trench region leaving a substantially planar material region in said recessed region, said substantially planar material region being self-aligned into said recessed region, said substantially planar material region being a floating gate;

forming a dielectric layer overlying said floating gate; and forming a control gate layer overlying said dielectric layer.

12. A method for forming a self-aligned polysilicon structure to isolation structures on a silicon substrate, comprising:

forming a first isolation structure and a second isolation structure, said first and second isolation structures defining a recessed region therebetween;

forming a polysilicon layer in said recessed region and overlying said first and second isolation structures, said polysilicon layer entirely filling the recessed region; and performing a chemical mechanical polishing process on said polysilicon layer to remove a portion of said polysilicon layer, wherein said polysilicon layer directly overlying an upper surface of said isolation structures is polished away to define said polysilicon structure that is self-aligned to said first and second isolation structures.

13. The method of claim 12, wherein said first and second isolation structures are shallow trench isolation structures.

14. The method of claim 12, wherein said polysilicon structure defines a gate structure of a transistor.

15. The method of claim 14, wherein said polysilicon structure is a floating gate of a non-volatile memory.

* * * * *